US007921996B2

(12) United States Patent
Seo et al.

(10) Patent No.: US 7,921,996 B2
(45) Date of Patent: Apr. 12, 2011

(54) CASE FOR PORTABLE ELECTRONIC DEVICE

(75) Inventors: Jong-weon Seo, Masan-si (KR); Jong-hoon Kim, Changwon-si (KR); Chang-sik Kim, Changwon-si (KR); Sang-moon Lee, Changwon-si (KR); Jeong-bae Kim, Changwon-si (KR)

(73) Assignee: Samsung Techwin Co., Ltd., Changwon (KR)

(*) Notice: Subject to any disclaimer, the term of this patent is extended or adjusted under 35 U.S.C. 154(b) by 560 days.

(21) Appl. No.: 11/644,111

(22) Filed: Dec. 22, 2006

(65) Prior Publication Data

US 2007/0164022 A1  Jul. 19, 2007

(30) Foreign Application Priority Data

Dec. 30, 2005  (KR) .................. 10-2005-0135903

(51) Int. Cl.
*B65D 85/00* (2006.01)
(52) U.S. Cl. ...................................... 206/320
(58) Field of Classification Search .................. 206/305, 206/320, 493, 316.1, 316.2; 29/524.1, 525.01, 29/525.06, 525.14; 156/70; 411/180, 181, 411/187, 188, 412; 220/326, 62.11, 62.16, 220/62.17, 62.22, 23.87, 23.89; 52/410, 52/511, 512
See application file for complete search history.

(56) References Cited

U.S. PATENT DOCUMENTS

| | | | | | |
|---|---|---|---|---|---|
| 2,746,637 | A | * | 5/1956 | Todd et al. | 220/62.11 |
| 3,632,465 | A | * | 1/1972 | Hardingham | 220/62.11 |
| 3,774,802 | A | * | 11/1973 | O'Cheskey | 220/62.11 |
| 3,916,756 | A | * | 11/1975 | Yoda | 24/682.1 |
| 5,131,558 | A | * | 7/1992 | Hiromori | 220/326 |
| 5,222,441 | A | * | 6/1993 | Weber | 105/208 |
| 5,489,176 | A | * | 2/1996 | Fultz | 411/181 |
| 5,934,729 | A | * | 8/1999 | Baack | 411/510 |
| 6,112,894 | A | * | 9/2000 | Kikuchi et al. | 206/493 |
| 6,665,922 | B2 | * | 12/2003 | Schultz | 29/525.02 |
| 6,920,977 | B1 | * | 7/2005 | VanSkiver et al. | 206/315.11 |
| 7,130,187 | B1 | * | 10/2006 | Sun | 206/320 |
| 2005/0054229 | A1 | * | 3/2005 | Tsuya et al. | 403/326 |

FOREIGN PATENT DOCUMENTS

| | | |
|---|---|---|
| CN | 1315067 A | 9/2001 |
| CN | 1322108 A | 11/2001 |
| KR | 10-2005-0061219 A | 6/2005 |

* cited by examiner

*Primary Examiner* — Luan K Bui
(74) *Attorney, Agent, or Firm* — Drinker Biddle & Reath LLP

(57) ABSTRACT

Provided is a case for a portable electronic device. The case includes an outer part; an inner part coupled to an inner surface of the outer part and including a plurality of holes; and fastening members, each including a main body having an outer diameter corresponding to an inner diameter of the hole in the inner part and a flange portion, wherein the flange portion is connected to an end portion of the main body, has an outer diameter greater than the outer diameter of the main body to be depressed into the inner part.

4 Claims, 7 Drawing Sheets

CASE FOR PORTABLE ELECTRONIC DEVICE

CROSS-REFERENCE TO RELATED PATENT APPLICATIONS

This application claims the benefit of Korean Patent Application No. 10-2005-0135903, filed on Dec. 30, 2005, in the Korean Intellectual Property Office, the disclosure of which is incorporated herein in its entirety by reference.

BACKGROUND

1. Field of the Invention

The present invention relates generally to a case for a portable electronic device. More particularly, the present invention relates to a case having improved reliability, durability, and reinforcing an assembling property with inner elements.

2. Description of the Related Art

Cases (also known as housings) made of plastic or magnesium, which are relatively inexpensive and have high plasticity and workability, are conventionally used for portable electronic devices such as mobile phones, digital cameras, laptop computers, MP3 players and portable media players (PMPs) to enclose and protect internal components of the portable electronic devices. However, in line with demands for sophistication of cases, diversification of materials for forming the cases, differentiation from other cases, increase of mass-production, and users' requests for certain form-factors or esthetics, metal cases have been developed that include thin metal plates formed of aluminum, stainless steel, or titanium.

Fastening members such as bosses are typically configured inside a case to couple inner elements to the case and/or couple portions of the case together (e.g., front and back housing portions). Conventionally, threaded bosses are attached onto an inner surface of a thin metal plate case using an electric welding process, however, welded bosses may be separated from the surface due to a deformation of the thin plate or external shocks. Meanwhile, a plastic case can be attached onto an inner surface of an outer thin metal plate case so that bosses can be coupled to the plastic case. However, a coupling force between the inner plastic case and the metal boss is weak. In addition, if bosses formed of a plastic material are used, strength of a screw tap in the boss is degraded.

Due to the above problems, a metal case is mainly used to support a plastic case, that is, to decorate, reinforce the structure of the case, or protect a liquid crystal display (LCD) window. Therefore, in order to use a metal case, an assembling property with fastening members in the case and the durability of the case must be improved.

SUMMARY

The present invention provides a metal case for a portable electronic device, the case having an improved durability and an improved assembling property with fastening members in the case.

According to an aspect of the present invention, there is provided a case for a portable electronic device including an outer part; an inner part coupled to an inner surface of the outer part and including a plurality of holes; and fastening members extending through the holes to be coupled to the inner case.

Each of the fastening members may include: a main body having an outer diameter corresponding to an inner diameter of the hole in the inner part; and a flange portion, which is connected to an end portion of the main body, that includes an outer diameter greater than the outer diameter of the main body, and is to be connected to the inner part.

The inner part may include a depressed area about each hole on its outer surface, and the depressed area may be configured to receive the flange portion of the fastening member so that the outer surface of the inner part can be in intimate contact with the inner surface of the outer part. Alternatively, the flange portion may be depressed onto the outer surface of the inner part after heating the inner part to a softening temperature. In another alternative, the fastening member may be formed of a material that is harder than a material of the inner part so that softening of the inner part is not required. In yet another alternative, the fastening member and the inner part may be coupled by welding the flange portion onto a portion of the inner part corresponding to the flange portion.

Each of the fastening members may further include: a rotation prevention portion that prevents the fastening member from rotating relative to the inner part. The rotation prevention portion may be formed on at least a part of the fastening member that contacts the inner part. The rotation prevention portion may be formed on an edge of the flange portion. Furthermore, the rotation prevention portion may include one or more protrusions. Moreover, the rotation prevention portion may be formed on an outer surface of the main body adjacent to the flange portion. In some embodiments, the rotation prevention portion may be provided by the flange portion that includes a polygonal perimeter.

The outer part of the case/housing may include a frontal outer part and a rear outer part, and the inner part includes a frontal inner part and a rear inner part. In one embodiment, the frontal inner part includes a protrusion portion on a lateral edge and the rear inner part includes a receiving portion on a lateral edge so that the protrusion portion and the receiving portion are coupled to each other. The protrusion portion may include a convex portion formed perpendicularly to the protruding direction and the receiving portion includes a concave portion corresponding to the convex portion so that the receiving portion and the protrusion portion are fixed to each other by the convex portion and the concave portion. In another embodiment, the frontal inner part includes a receiving portion on a lateral edge and the rear inner part includes a protrusion portion on a lateral edge so that the protrusion portion and the receiving portion are coupled to each other. The protrusion portion may include a convex portion formed perpendicularly to the protruding direction and the receiving portion includes a concave portion corresponding to the convex portion so that the receiving portion and the protrusion portion are fixed to each other by the convex portion and the concave portion.

DETAILED DESCRIPTION OF THE EMBODIMENTS

Figure 1:
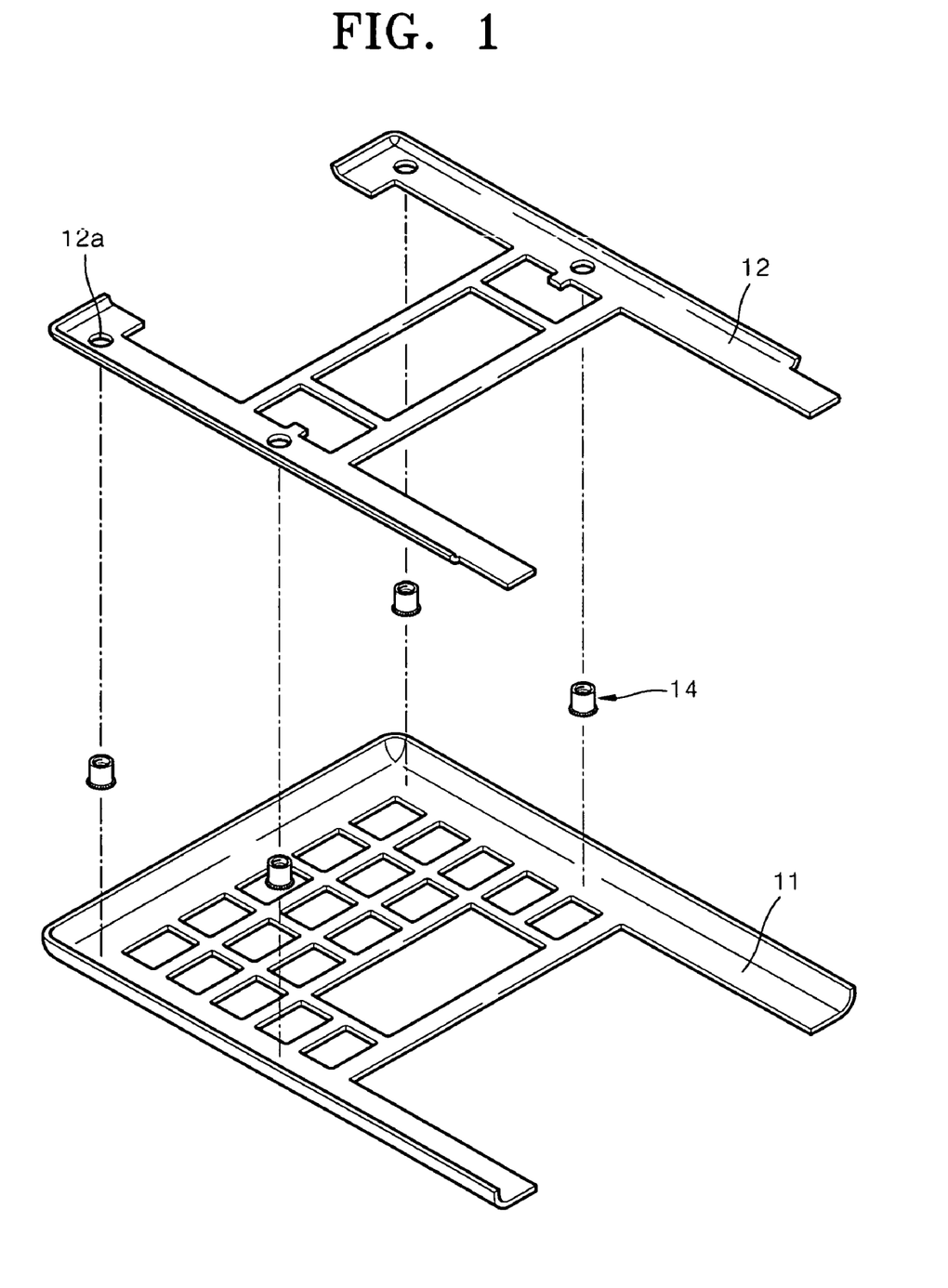
FIG. 1 is a partially exploded perspective view of a frontal part of a metal case according to an embodiment of the present invention.
Figure 2:
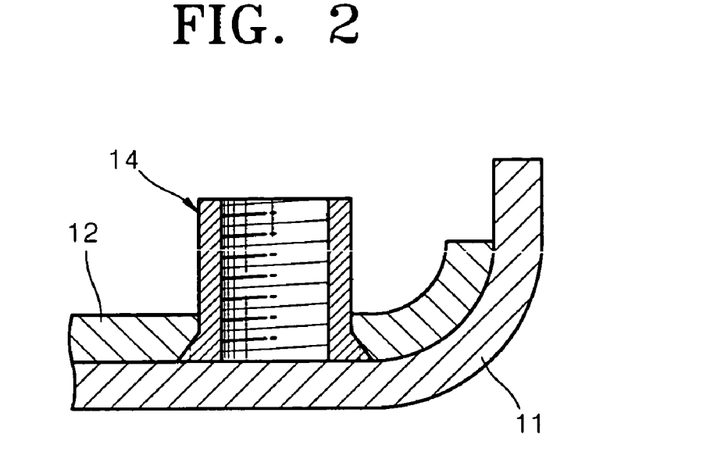
FIG. 2 is a cross-sectional view of an inner coupling structure in the metal case of FIG. 1.

Referring now to the Figures, FIG. 1 is a partially exploded perspective view of a frontal part 10 (FIG. 10) of a metal case according to an embodiment of the present invention, and FIG. 2 is a cross-sectional view of an inner coupling structure in the metal case of FIG. 1. Referring to FIGS. 1 and 2, the frontal part 10 (FIG. 10) includes an inner part 12, to which bosses 14 are coupled, and an outer part 11. The inner part 12 and the outer part 11 are formed by, for example, a pressing method, of a metal material such as aluminium, stainless steel, or titanium. Fastening members such as the bosses 14, ribs, hooks may also be formed of the same metal material when the inner part 12 is formed. The bosses 14 extend through a plurality of holes 12a formed in the inner part 12. The bosses 14 may be fixed to the inner part 12 using thermal bonding, gluing or the like. After fixing the bosses 14 to the holes 12a of inner part 12, the inner part 12 is fixedly coupled to the outer part 11 using a welding process, for example, spot welding, arc spot welding, or laser beam welding. In particular, since the inner part 12 and the outer part 11 are formed of the same metal and have large bonding areas, the spot welding can be performed many times to improve an adhesive force between the inner part 12 and the outer part 11.

Figure 3A:
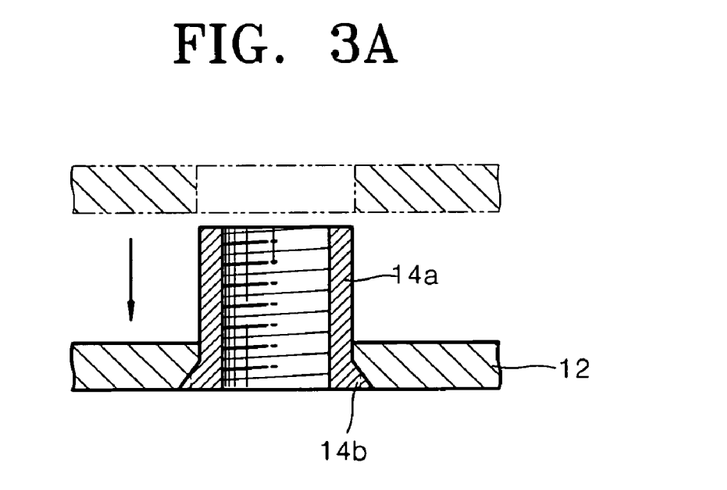
FIG. 3A is a cross-sectional view illustrating coupling of a fastening member to an inner part of the metal case of FIG. 1.
Figure 3B:
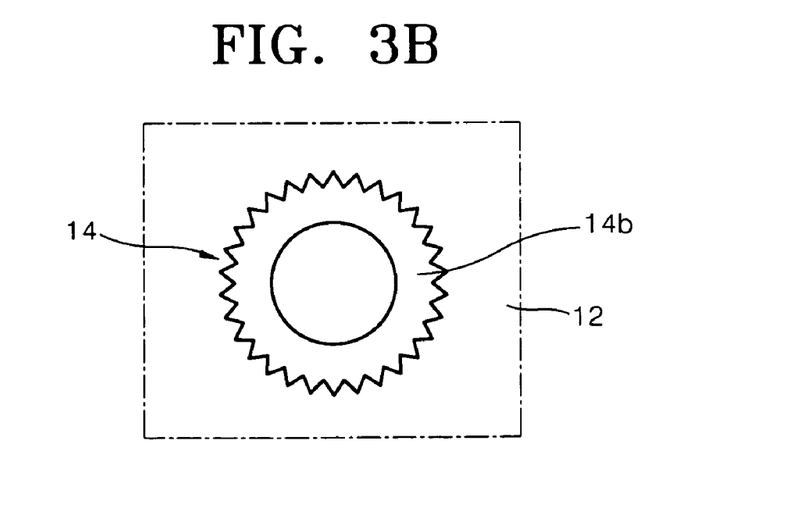
FIG. 3B is a bottom view of the inner part of the metal case of FIG. 1 with the fastening member coupled thereto.
Figure 4:
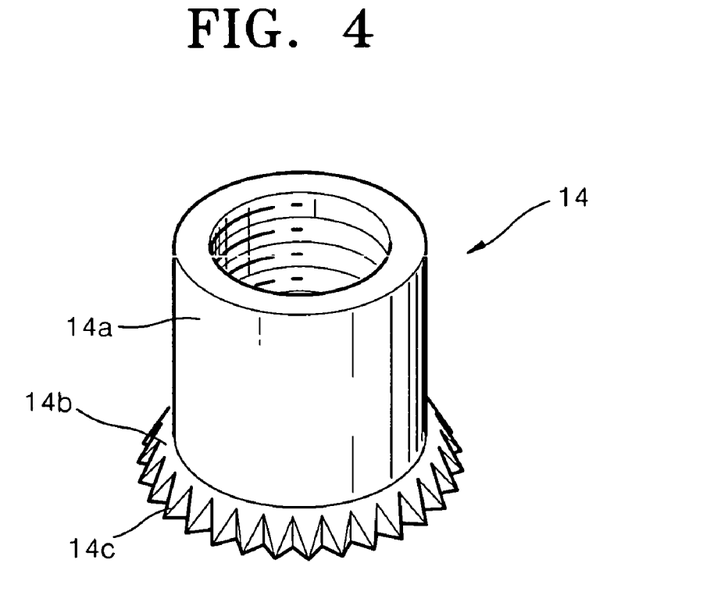
FIG. 4 is a perspective view of a first embodiment of a fastening member.
Figure 5:
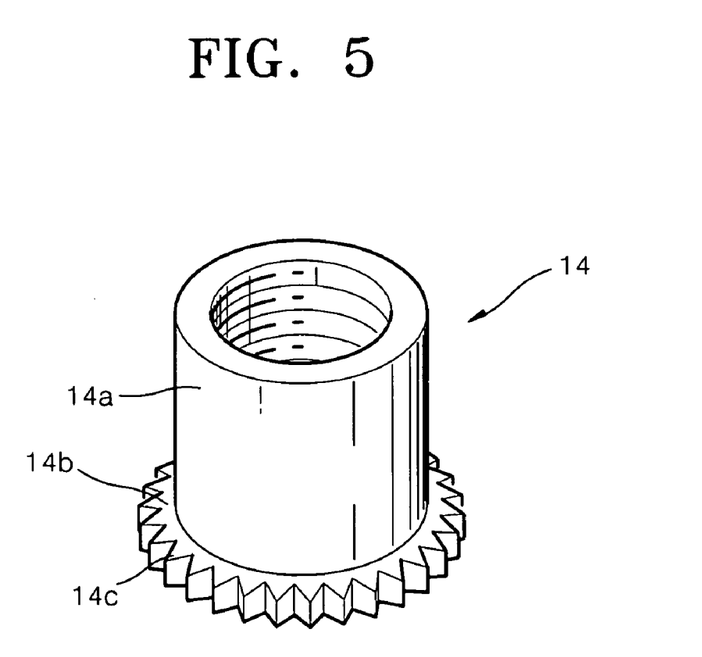
FIG. 5 is a perspective view of a second embodiment of a fastening member.
Figure 10:
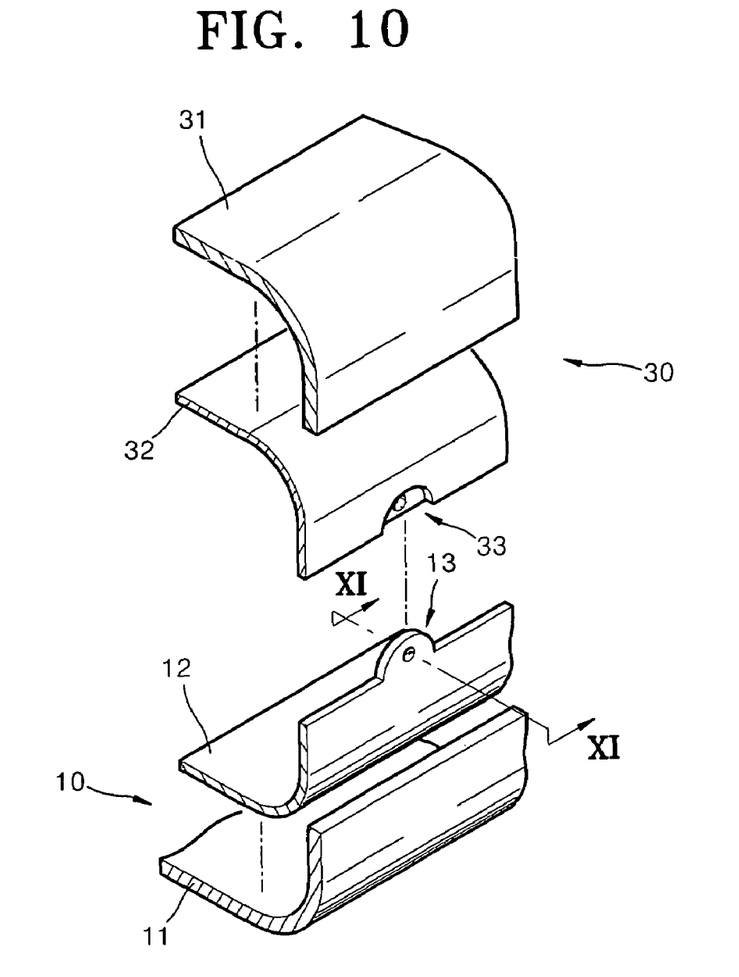
FIG. 10 is a partially exploded perspective view showing assembly of the metal case of FIG. 1.

Hereinafter, a process of coupling fastening members such as the bosses 14 to the inner part 12 will be described. In the drawings, the bosses 14 are shown as an example of suitable fastening members, however, the fastening members can be any members, such as ribs or hooks, for supporting and coupling inner elements onto the metal case 11, 31 (FIG. 10). FIG. 3A illustrates an example process of coupling the boss 14 to the inner part 12, and FIG. 3B is a bottom view of the inner part 12 to which the boss 14 was coupled. An example process of connecting the fastening member to the inner part 12 will now be described with reference to FIGS. 3A and 3B. As shown in FIG. 3A, an outer diameter of a main body 14a of the boss 14 corresponds substantially to a diameter of a hole formed in the inner part 12. A diameter of a flange portion 14b formed on the lower portion of the main body 14a is larger than the outer diameter of the main body 14a, and a thickness or height of the flange portion 14b is smaller than that of the inner part 12. In some instances, the boss 14 may be formed of a material that is harder than the material of the inner part 12. Thus, as shown in FIG. 3A, when the boss 14 is inserted into the hole 12a of the inner part 12, the flange portion 14b may bite into or otherwise deform the inner part 12 so that the bottom surface of inner part 12 is substantially planar for intimate contact with the outer part 11. In addition, as shown in FIG. 4, rotation prevention portions 14c formed as saw teeth may be formed on an outer circumferential portion of the flange portion 14b, and the flange portion 14b can be inclined toward the outer portion thereof (e.g., generally frustoconically-shaped). As shown in FIG. 5, the rotation prevention portions 14c formed on the flange portion 14b as saw teeth may be configured to be planar or otherwise have a constant height.

In some instances, to fixedly couple the bosses 14 to the inner part 12, the main body 14a of each of the bosses 14 is inserted into the hole 12a (FIG. 1) in the inner part 12, and then, the inner part 12 is heated to a softening temperature, after which the inner part 12 and the boss 14 are pressed together to deform the inner part 12. At this time, upon heating the inner part 12 formed of a material softer than that of the boss 14, the inner part 12 is depressed so as to correspond to the shape of the flange portion 14b during pressing, and then, fixedly coupled to the boss 14 in the depressed state. The rotation prevention portions 14c formed as saw teeth thus bites into the inner portion 12 to prevent rotation of the boss 14. As will be discussed hereinafter, the rotation prevention portions 14c may be configured otherwise to prevent rotation, for example with a polygonal or non-circular perimeter for the flange portion 14b.

Another example method of coupling the fastening member to the inner part 12 according to another embodiment of the present invention is to insert a main body 14a of the boss 14 into the hole of the inner part 12, and to couple the flange portion 14b to an abutment surface of the inner part 12 using a welding process. A spot welding or a laser beam welding can be used. Here, in order to perform the welding process easily, an upper surface of the flange portion 14b can be parallel, instead of being inclined as shown in FIG. 3A. Of course, coupling of the boss 14 with the inner part 12 may be accomplished by other methods, for example adhesive bonding, cohesive bonding, etc.

Meanwhile, a bottom surface of the boss 14, that is, of the flange portion 14b, and a bottom surface of the inner part 12 are substantially the same height as each other so that the bottom surfaces are coplanar for intimate contact with the outer part 12. As shown in FIG. 3A, the flange portion 14b can be pushed upward into the inner part 12 for the inner part 12 to be depressed so that an upper surface of the inner part 12 can be flat. Otherwise, the flange portion 14b can push the inner part 12 upward so that a portion around the hole in the inner part 12 can be curved upward. This is dependent on the thickness of the inner part 12 and a degree of hardness of the material forming the inner part 12.

In addition, the inner part 12, to which the bosses 14 are fixed, and the outer part 11 are fixedly coupled to each other using the welding method. The inner part 12 can reinforce the structure of the outer part 11 so that a utility function of the thin metal plate case can be improved. In addition, since the fastening members are not directly coupled to the outer part 11 but are instead coupled to the inner part 12, an outer appearance of the outer part 11 is not deteriorated.

Since the saw-tooth type rotation prevention portions 14c protrude from an edge of the flange portion 14b, the rotation of bosses 14 after performing the coupling process can be prevented. In addition, the flange portion 14b of the boss 14 is held captive between the inner part 12 and the outer part 11 once the inner part 12 and the outer part 11 are coupled, and thus, the boss 14 is not separated from the parts 11 and 12 even if an external shock is applied thereto. Also, since the assembling property between the boss 14 and the parts 11 and 12, as can be appreciated, there is no limitation in a height or a diameter of the boss 14 so that various types of inner elements can be appropriately accommodated in the metal case.

Figure 6A:
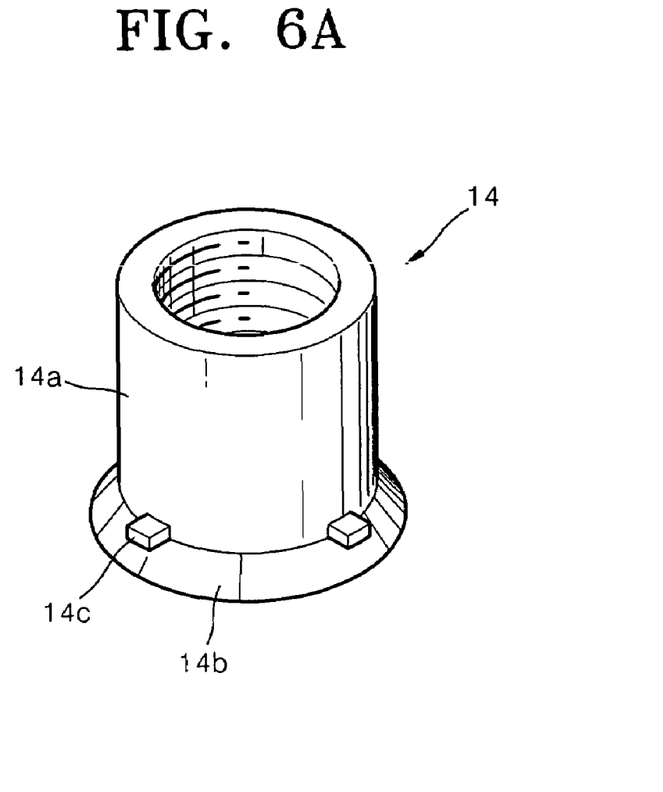
FIGS. 6A and 6B are a perspective view and a cross-sectional view of a third embodiment of a fastening member.
Figure 6B:
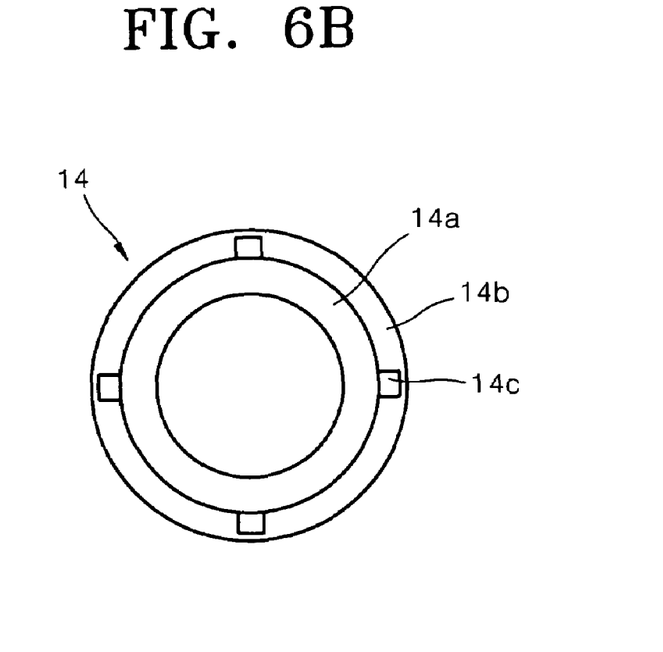
Figure 7:
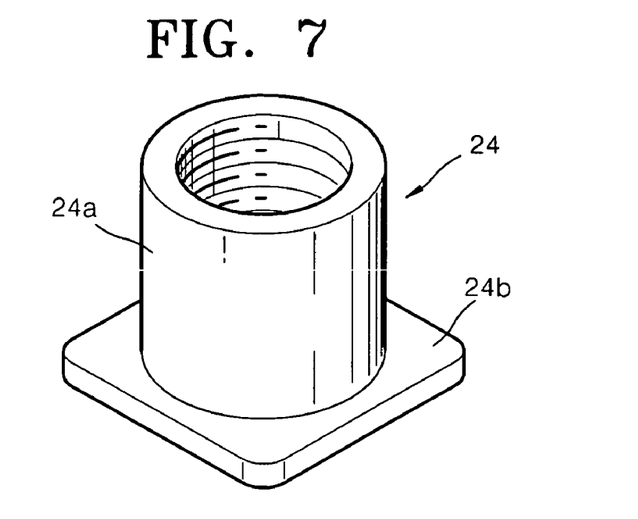
FIG. 7 is a perspective view of a fourth embodiment of a fastening member.

The rotation prevention portions 14c can be formed on the edge of the flange portion 14b as shown in FIGS. 4 and 5. However, as shown in FIGS. 6A and 6B, the rotation prevention portions 14c can be formed on a boundary between the flange portion 14b and the main body 14a, that is, an outer surface of the main body 14a, which is close to the flange portion 14b. In addition, although four rotation prevention portions 14c are shown in FIG. 6B, fewer or additional rotation prevention members 14c can be provided. Moreover, the flange portion 14b is not necessarily formed as a circle, and as shown in FIG. 7, a flange portion 24b can be formed as a polygon having a perimeter that is greater than an outer circumference of a main body 24a. Because the flange portion 24b is non-circular, has a perimeter that is greater than a diameter of the hole 12a (FIG. 1), and is depressed into the inner part 12 during coupling thereto, the polygonal flange portion 24b cannot rotate.

Figure 8:
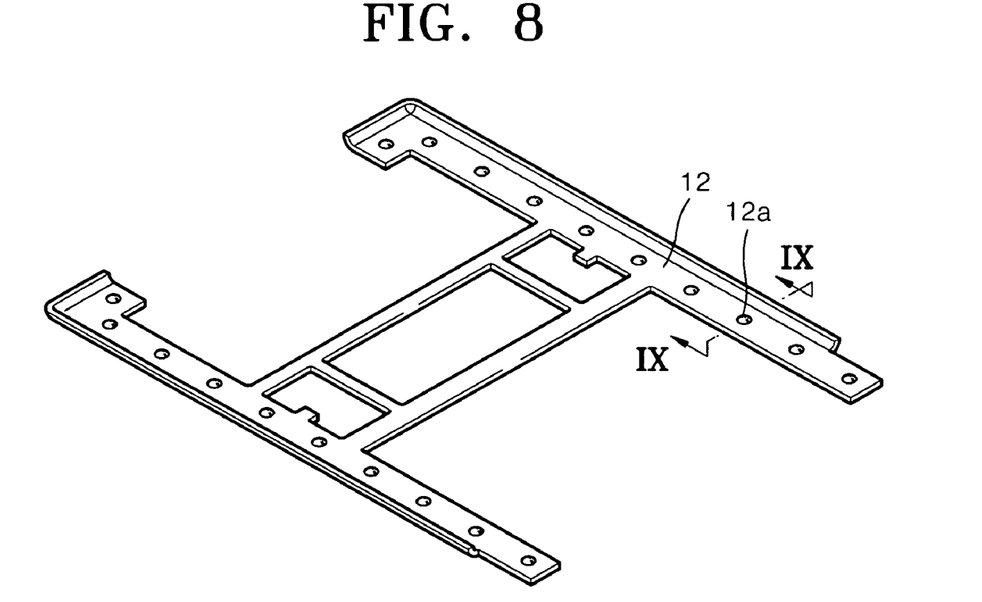
FIG. 8 is a perspective view of the inner part of the metal case of FIG. 1 showing embossed portions formed thereon.
Figure 9:
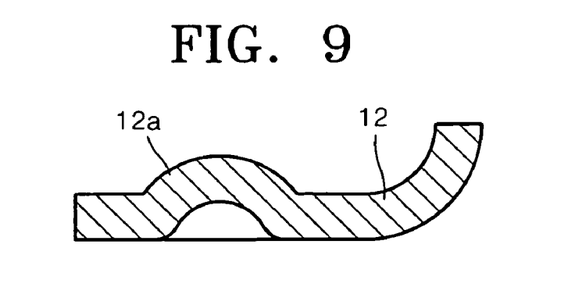
FIG. 9 is a cross-sectional view of the inner part of FIG. 8, taken along line IX-IX.

FIG. 8 is a perspective view of embossed portions formed on the inner part 12 according to an embodiment of the present invention, and FIG. 9 is a cross-sectional view of the inner part 12 on which an embossed portion is formed, taken along line IX-IX of FIG. 8. The embossed portions 12a protruding from the inner part 12 can reinforce the strength of the inner part 12, and thus, a thickness of the inner part 12 and a weight of the metal case can be reduced.

Figure 11:
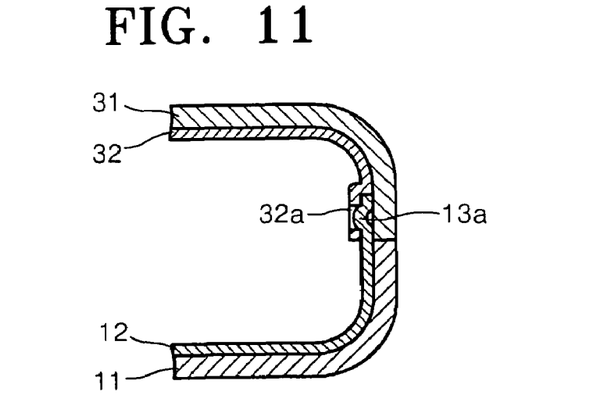
FIG. 11 is a cross-sectional view of the metal case of FIG. 10 taken along line XI-XI.

FIG. 10 is a partially exploded perspective view showing the metal case of FIG. 1 after coupling a protrusion portion 13 of the frontal part 10 with a receiving portion 33 of a rear part 30 of the metal case, and FIG. 11 is a cross-sectional view of the metal case of FIG. 10 taken along line XI-XI of FIG. 10. Referring to FIGS. 10 and 11, the protrusion portion 13 protruding toward the rear part 30 is formed on a lateral edge of the frontal inner part 12 that is coupled to the outer part 11. The receiving portion 33 that can receive the protrusion portion 13 is formed on a lateral edge of a rear inner part 32 that is coupled to a rear outer part 31. Additionally a convex portion 13a is formed on an inner side of the protrusion portion 13 and a concave portion 33a is formed on the receiving portion 33 to correspond to the convex portion 13a. Thus, the convex portion 13a is inserted into the concave portion 33a when the protrusion portion 13 is coupled with the receiving portion 33. Therefore, the frontal part 10 and the rear part 30 of the metal case become removably coupled to each other.

Figure 12:
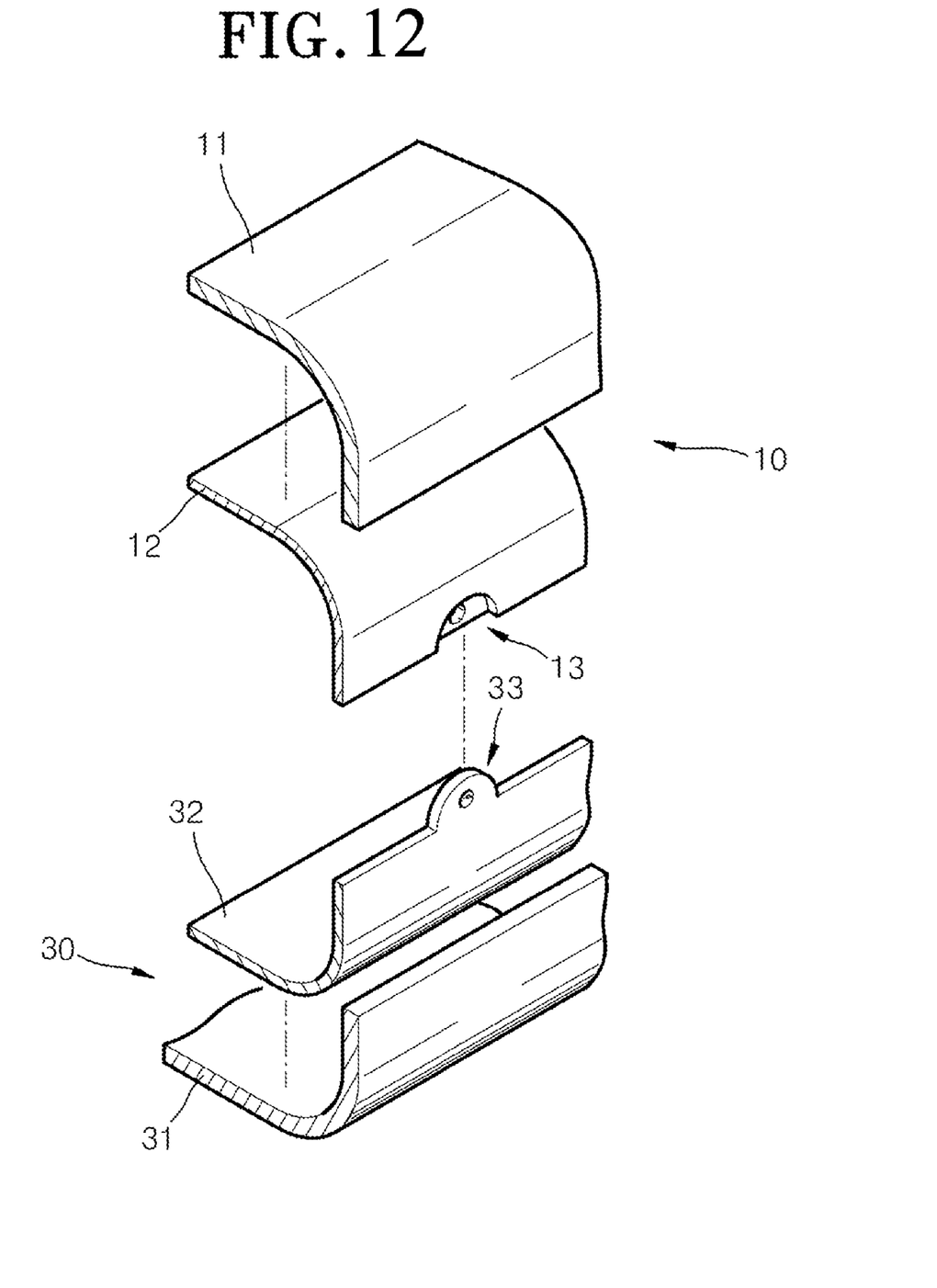
FIG. 12 is a partially exploded perspective view showing an embodiment of the metal case as shown in FIG. 10 with the reference characters modified.

In contrast to the configuration shown in FIG. 10, and as shown in FIG. 12, the frontal and rear parts 10, 30 may be configured vice versa with respect to the convex portion 13a and the concave portion 33a and/or the protrusion portion 13 and receiving portion 33. For example, a protrusion portion protruding toward the frontal part 10 can be formed on a lateral edge of the rear inner part 32 that is coupled to the rear outer part 31. A receiving portion that can receive the protrusion portion can be formed on a lateral edge of a frontal inner part 12 that is coupled to the frontal outer part 11. Additionally, a convex portion is formed on an inner side of the protrusion portion and a concave portion is formed on the receiving portion to correspond to the convex portion. Thus, the convex portion can be inserted exactly into the concave portion when the protrusion portion is inserted into the receiving portion.

Therefore, the frontal part and the rear part of the metal case can be exactly arranged and fixed to each other.

In the above embodiments, the outer part 11 and the inner part 12 of the metal case are formed of metal, however, the present invention is not limited thereto. For example, the outer part 11 can be formed of a non-metallic material, and accordingly, the outer part 11 and the inner part 12 can be coupled to each other appropriately.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A case for a portable electronic device, the case comprising:
   an outer part;
   an inner part fixedly coupled to an inner surface of the outer part and including a plurality of holes; and
   fastening members that extend away from the outer part through the plurality of holes, the fastening members being coupled to the inner part and held captive by contacting the outer part and inner part;
   wherein:
   the outer part includes a frontal outer part and a rear outer part and the inner part includes a frontal inner part and a rear inner part, and
   the frontal inner part includes a protrusion portion on a lateral edge and the rear inner part includes a receiving portion on a lateral edge, the protrusion portion and the receiving portion being configured to engage each other to releasably couple the frontal outer part and the rear outer part to each other.

2. The case of claim 1, wherein the protrusion portion includes a convex portion formed perpendicularly to the protruding direction and the receiving portion includes a concave portion corresponding to the convex portion.

3. A case for a portable electronic device, the case comprising:
   an outer part;
   an inner part fixedly coupled to an inner surface of the outer part and including a plurality of holes; and
   fastening members that extend away from the outer part through the plurality of holes, the fastening members being coupled to the inner part and held captive by contacting the outer part and inner part;
   wherein:
   the outer part includes a frontal outer part and a rear outer part and the inner part includes a frontal inner part and a rear inner part, and
   the frontal inner part includes a receiving portion on a lateral edge and the rear inner part includes a protrusion portion on a lateral edge, the protrusion portion and the receiving portion being configured to engage each other to releasably couple the frontal outer part and the rear outer part to each other.

4. The case of claim 3, wherein the protrusion portion includes a convex portion formed perpendicularly to the protruding direction and the receiving portion includes a concave portion corresponding to the convex portion.

* * * * *